US010566975B1

(12) United States Patent
Tiwari et al.

(10) Patent No.: US 10,566,975 B1
(45) Date of Patent: Feb. 18, 2020

(54) LEVEL TRANSLATOR FOR SPMI BUS (71) Applicant: NXP B.V., Eindhoven (NL)

(72) Inventors: Chandra Prakash Tiwari, Bangalore (IN); Anand Shirwal, Bangalore (IN)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/412,329

(22) Filed: May 14, 2019

(51) Int. Cl.
*H03K 19/003* (2006.01)
*H03K 3/356* (2006.01)
*H03K 19/0185* (2006.01)
*G06F 13/20* (2006.01)

(52) U.S. Cl.
CPC ..... *H03K 19/018507* (2013.01); *G06F 13/20* (2013.01)

(58) Field of Classification Search
CPC combination set(s) only.
See application file for complete search history.

(56) References Cited

U.S. PATENT DOCUMENTS

| 5,896,043 | A | 4/1999 | Kumagi |
| 6,781,415 | B2 | 8/2004 | Clark et al. |
| 6,822,480 | B1 | 11/2004 | McCalmont |
| 7,355,447 | B2 | 4/2008 | Wood et al. |
| 7,696,786 | B2 | 4/2010 | Laulanet et al. |
| 7,928,766 | B2 | 4/2011 | Welty |
| 7,948,810 | B1 | 5/2011 | Tang et al. |
| 8,643,425 | B2 | 2/2014 | Chaudhry et al. |
| 9,647,645 | B1 | 5/2017 | Schaffer et al. |
| 10,181,852 | B1 * | 1/2019 | Tiwari ............ H03K 19/00361 |

OTHER PUBLICATIONS

MIPI Alliance, "MIPI SPMI System Power Management Interface", presentation pp. 1-5, 2012.
NXP Semiconductors B.V., "Voltage Translation, How to Manage Mixed-Voltage Designs with NXP Level Translators," Doc. No. 9397 750 17511, May 2014.

\* cited by examiner

*Primary Examiner* — An T Luu (57) ABSTRACT

A bi-directional level translator with fast rise and fall times and low current leakage is suitable for use with devices connected using a SPMI bus. The level translator passes signals between first and second voltage domains that operate at different voltage levels. The level translator has a first terminal that receives a first signal A from the first voltage domain and outputs a second signal B to the second voltage domain. A second terminal receives the second signal B and outputs the first signal A. A first switch is located between the first voltage source and the first terminal and a second switch is located between the second voltage source and the second terminal. The first and second switches are operable to reduce current leakage of the level translator.

20 Claims, 4 Drawing Sheets

| Input | Output |
|---|---|
| Transition rising edge ⤴ | ⤴ Follow the input signal (drive greater than 2mA) |
| 1 | High (via pull-up) |
| Transition falling edge ⤵ | ⤵ Follow the input signal (drive greater than 2mA) |
| 0 | 0 |
| High to Z | No change (remains High) |
| Low to Z | Follow the input signal (via pass transistor) |

LEVEL TRANSLATOR FOR SPMI BUS

BACKGROUND

The present invention relates generally to mixed voltage logic circuits, and, more particularly, to a level translator circuit.

Voltage level translators or level shifters are circuits that resolve voltage incompatibilities between different parts of a system that operate in different voltage domains, which is quite common in systems today, especially in systems that interface with legacy devices. Level shifters can be designed to span a wide range of voltages, frequencies, bit widths and IO types (open-drain or push-pull) at various performance levels. Level shifters also have been designed for standard interfaces, such as I2C bus, SD cards, and SIM cards.

For mobile devices, which operate using energy stored in a battery, low power and low leakage are important circuit design considerations. Today's mobile devices often include a SPMI (System Power Management Interface) bus, which is a 2-wire, bi-directional interface that passes signals (SDATA and SCLK) between multiple master devices and multiple slave devices.

It would be advantageous to have a fast, accurate level translator suitable for use with a SPMI bus.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION

The detailed description of the appended drawings is intended as a description of the currently preferred embodiments of the present invention and is not intended to represent the only form in which the present invention may be practiced. It is to be understood that the same or equivalent functions may be accomplished by different embodiments that are intended to be encompassed within the spirit and scope of the present invention.

In one embodiment, the present invention provides a level translator that receives an input signal at an input terminal, and generates an output signal at an output terminal. The level translator includes first, second, third and fourth one-shot circuits, where the first and third one-shot circuits each has an output connected to the output terminal and the second and fourth one-shot circuits each has an output connected to the input terminal. A first transistor has a source connected to a first voltage source, a drain connected to the input terminal, and a gate connected to an input of the first one-shot circuit. A second transistor has a drain connected to a second voltage source that is different from the first voltage source, a source connected to the output terminal, and a gate connected to an input of the second one-shot circuit. A third transistor has a source connected to the input terminal, a drain connected to ground, and a gate connected to an input of the third one-shot circuit. A fourth transistor has a source connected to ground, a drain connected to the output terminal, and a gate connected to the input of the fourth one-shot circuit. A first switch is connected in parallel with the first transistor and has a first terminal connected to the first voltage source and a second terminal connected to the input terminal. A second switch is connected in parallel with the second transistor and has a first terminal connected to the second voltage source and a second terminal connected to the output terminal.

In another embodiment, the present invention is an output driver circuit for a level translator, where the level translator receives an input signal at an input terminal, and generates an output signal at an output terminal. The output driver circuit includes first and second one-shot circuits and first through tenth transistors. Each of the first and second one-shot circuits has an input and an output. The first transistor has a source connected to a first voltage source (VCCA) and a gate that receives a buffered version of the input signal. The second transistor has a source connected to ground and a gate that receives the buffered version of the input signal. The third and fourth transistors are connected in series, where a source of the third transistor is connected to the first voltage source (VCCA), a source of the fourth transistor is connected to a drain of the second transistor, drains of the third and fourth transistors are connected together, and gates of the third and fourth transistors receive an output enable signal (OE). The fifth and sixth transistors are connected in series between the first voltage source (VCCA) and ground, where drains of the fifth and sixth transistors are connected together and to the outputs of the first and second one-shot circuits. The seventh and eighth transistors are connected in series between the first voltage source (VCCA) and ground, where the seventh and eighth transistors have drains that are connected together and gates that are connected to respective ones of the inputs of the first and second one-shot circuits. The ninth transistor has a source connected to the input terminal, a drain connected to the output terminal, and a gate that is activated by the output enable signal (OE). The tenth transistor has a source connected to the first voltage source (VCCA), a drain connected to the output terminal, and a gate that is activated by the output enable signal (OE).

In yet another embodiment, the present invention provides a system including a first voltage domain connected to a first voltage source for operating at a first voltage level (VCCA), a second voltage domain connected to a second voltage source for operating at a second voltage level (VCCB) different from the first voltage level, and a level translator located between the first and second voltage domains for passing signals therebetween, such that a first signal A passed from the first voltage domain to the second voltage domain has a voltage level thereof changed to the second voltage level, and a second signal B passed from the second voltage domain to the first voltage domain has a voltage level thereof changed from the second voltage level to the first voltage level. The level translator includes a first terminal that receives the first signal A and outputs the second signal B, and a second terminal that receives the second signal B and outputs the first signal A. A first switch is located between the first voltage source and the first terminal and a second switch is located between the second voltage source and the second terminal. The first and second switches are operable to reduce current leakage of the level translator.

Various embodiments of the present invention provide a level translator. The level translator has a low leakage current and is fast enough (fast rise and fall times) to be suitable for use in systems that use the SPMI protocol to allow multiple masters to communicate with multiple slaves.

The terms "input" and "output" are used for convenience and do not necessarily mean that a signal or terminal bearing such name is strictly one or the other. For example, in a bi-directional level shifter, sometimes the A terminal is an input, in which case the B terminal in an output, but at other times, B is the input and A is the output. Thus, although the A terminal may be labeled as the input terminal, it will be understood by those of skill in the art that the A terminal is at other times an output terminal.

The term "one-shot" refers to a one-shot multi-vibrator, which is a circuit that generates an output pulse having a predetermined width in response to a trigger signal. Such circuits can be implemented using a pair of transistors connected to resistors and capacitors, or an operational amplifier with feedback to the A and B inputs, as will be understood by those of skill in the art. The one-shot is a standard circuit used in level translators. The present invention will work with any one-shot so no preferred one-shot design is proffered.

Figure 1:
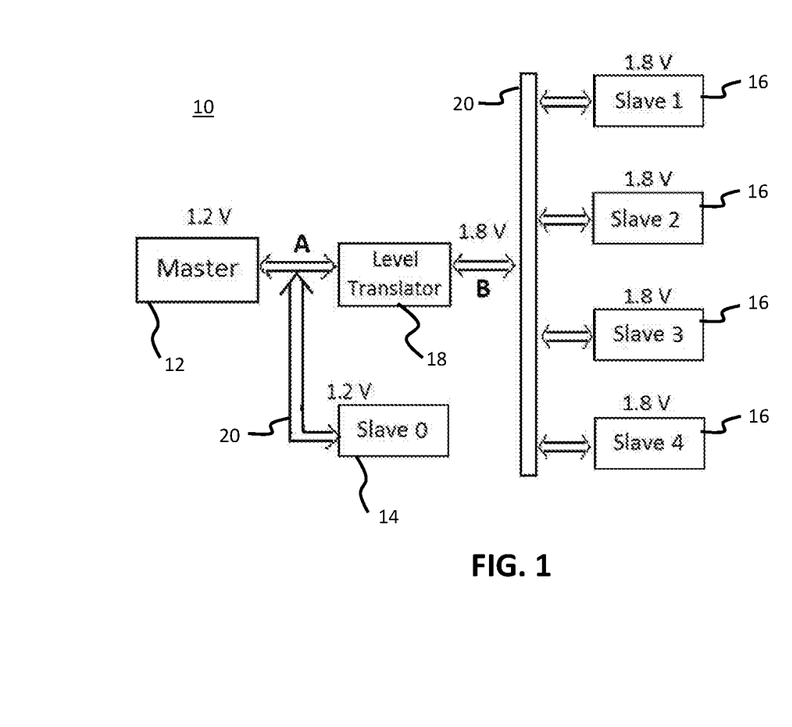
FIG. 1 is a schematic block diagram of a system having a master that communicates with multiple slaves using the SPMI protocol.

Referring now to FIG. 1, a schematic block diagram of a system 10 having a master 12 operating at 1.2V that communicates with a first slave 14, also operating at 1.2V, and a plurality of second slaves 16, operating at 1.8V. The master 12 communicates directly with the first slave 14 since they are both operating at 1.2V. However, the signals passed between the master 12 and the second slaves 16 are transmitted by way of a level translator 18 in accordance with an embodiment of the present invention because the master 12 and the second slaves 16 have different operating voltages. The level translator 18 shifts the voltage of the signals supplied by the master 12 from 1.2V to 1.8V, and shifts the voltage of the signals supplied by the second slaves 16 to the master 12 from 1.8V to 1.2V. The master 12 communicates with the second slaves 16 using a bus 20, which is disposed between the level translator 18 and the second slave devices 16, and since the master 12 is communicating with multiple slaves 14 and 16, the SPMI protocol may be used.

Figure 2:
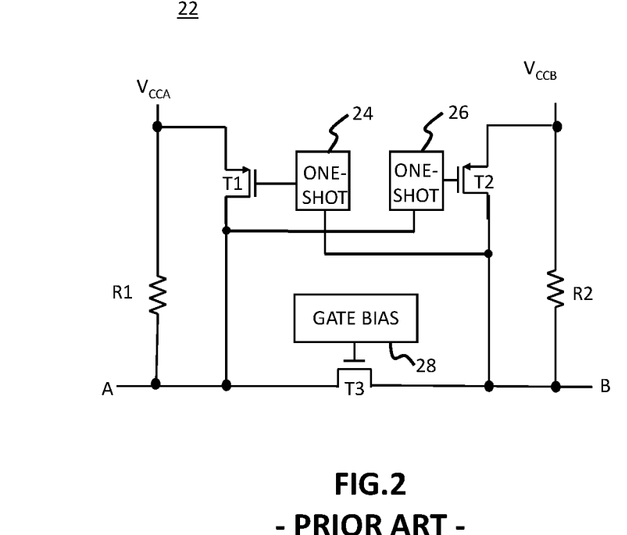
FIG. 2 is a schematic circuit diagram of a known open-drain type level translator.

FIG. 2 is a schematic circuit diagram of a known open-drain type level translator 22. The level translator 22 includes first and second output transistors T1 and T2, a biasing transistor T3, first and second one-shots 24 and 26, first and second resistors R1 and R2, and a gate bias circuit 28. The level translator 22 translates an input signal at a first voltage level to an output signal at a second voltage level. The level translator 22 has two I/O terminals labeled A and B, so if A is on the higher voltage side (e.g., 1.8V) and B is on the lower voltage side (e.g., 1.2V), then a signal input on terminal A is translated from 1.8V when high and output on terminal B at 1.2V, while a signal input on terminal B is translated from 1.2V when high and output on terminal A at 1.8V.

The first resistor R1 is connected between a first supply voltage VCCA and the first I/O terminal A, and the second resistor R2 is connected between a second supply voltage VCCB and the second I/O terminal B. The first transistor has a source connected to the first supply voltage VCCA, a drain connected to the first I/O terminal A, and a gate terminal connected to the first one-shot 24, and the second transistor has a source connected to the second supply voltage VCCB, a drain connected to the second I/O terminal B, and a gate terminal connected to the second one-shot 26.

The biasing transistor T3 has source and drain terminals connected to the first and second I/O terminals A and B, respectively, and a gate terminal connected to the gate bias circuit 28. The gate bias circuit 28 generates a gate voltage (i.e., $V_T + V_{cc(A)}$, where $V_T$ is a threshold voltage of the biasing transistor T3) to bias the gate of the biasing transistor T3. Further details and a description of the operation of the level translator 22 may be found in U.S. Pat. No. 10,181,852 assigned to NXP B. V.

While the level translator 22 works well, the first and second pull-up resistors R1 and R2 are always on, leading to a leakage current. In addition, the signal rise and fall times are not fast enough to meet the SPMI bus specifications.

Figure 3:
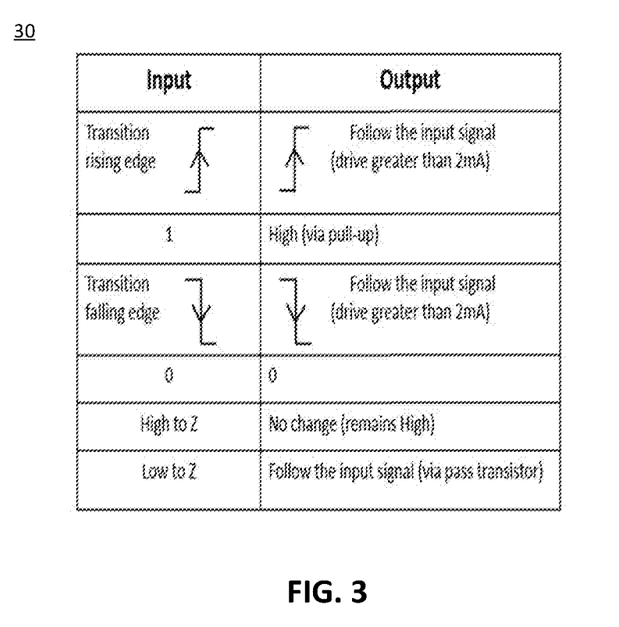
FIG. 3 is a truth table for the logic states of the SPMI bus.

FIG. 3 is a truth table 30 of for the SPMI bus. FIG. 3 shows that when the input signal goes from low to high or high to low, then the output signal follows the input signal; when the input signal is either high or low, then the output signal should be the same (high or low); when the input signal goes from high to Z, then the output signal should remain high; and when the input signal goes from low to Z, then the output signal should follow the input signal.

Figure 4:
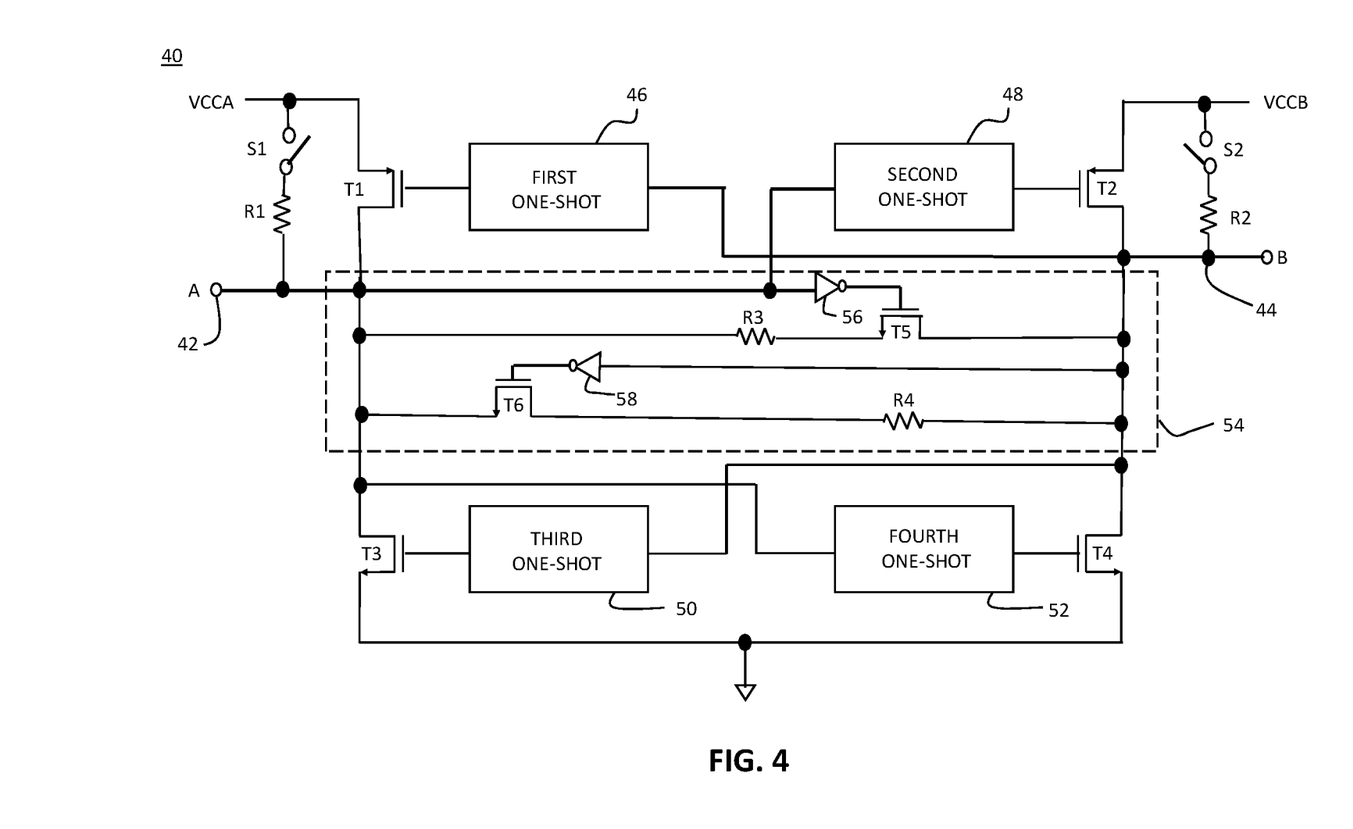
FIG. 4 is a simplified schematic diagram of a single channel level translator in accordance with a preferred embodiment of the present invention.

FIG. 4 is a simplified schematic diagram of a single channel level translator 40 in accordance with a preferred embodiment of the present invention. The level translator 40 receives an input signal "A" from a first voltage domain at a first terminal 42 and generates an output signal "B" at a second terminal 44 for a second voltage domain.

The level translator 40 has first, second, third and fourth one-shot circuits 46, 48, 50 and 52. The first and third one-shot circuits 46 and 50 each has an input connected to the output terminal 44 and the second and fourth one-shot circuits 48 and 52 each has an input connected to the input terminal 42.

There is a first transistor T1 that has a source connected to a first voltage source VCCA, a drain connected to the first terminal 42, and a gate connected to an output of the first one-shot circuit 46. A second transistor T2 has a drain connected to a second voltage source VCCB that is different from the first voltage source VCCA, a source connected to the second terminal 44, and a gate connected to an output of the second one-shot circuit 48. A third transistor T3 has a drain connected to the first terminal 42, a source connected to ground, and a gate connected to an output of the third one-shot circuit 50. A fourth transistor T4 has a source connected to ground, a drain connected to the second terminal 44, and a gate connected to the output of the fourth one-shot circuit 52.

A first switch S1 is connected in parallel with the first transistor T1. The first switch S1 has a first terminal connected to the first voltage source VCCA and a second terminal connected to the first terminal 42 by way of a first resistor R1. Thus, as can be seen, the first switch S1 and the first resistor R1 are connected in parallel with the first transistor T1. A second switch S2 is connected in parallel with the second transistor T2. The second switch S2 has a first terminal connected to the second voltage source VCCB and a second terminal connected to the second terminal 44 by way of a second resistor R2. Thus, the second switch S2 and the second resistor R2 are connected in parallel with the second transistor T2.

The first switch S1 is operated to be ON during a rise time of the input signal A. Similarly, the second switch S2 is operated to be ON during a rise time of B when B is the input signal. Conversely, at other times, the first and second switches S1 and S2 are OFF, so in this way, the first and second switches S1 and S2 are configured to reduce leakage current. The control of the switches S1 and S2 will be shown in more detail with respect to FIG. 5.

In operation, when the input signal A goes from low to high, the output signal B is pulled high; when the input signal A is high, the output signal B stays high; when the input signal A goes from high to low, the output signal B is pulled low; and when the input signal A is low, the output signal B stays low. The level translator 40 works similarly in the opposite direction, when B is the input signal and A is the output signal. More particularly, in such case, when B (terminal 44) goes from low to high, A (terminal 42) is pulled high; when B is high, A stays high; when B goes from high to low, A is pulled low; and when B is low, A stays low.

The level translator 40 further includes some control circuitry 54, which includes a fifth transistor T5, a sixth transistor T6, third and fourth resistors R3 and R4, and inverters 56 and 58. The fifth transistor T5 has a source connected to the first terminal 42 by way of the third resistor R3, a drain connected to the second terminal 44, and a gate connected to the first terminal 42 by way of the first inverter 56, where the input of the inverter 56 is connected to the first terminal 42 and the output of the inverter 56 is connected to the gate of T5. The sixth transistor T6 has a source connected to the first terminal 42, a drain connected to the second terminal 44 by way of the fourth resistor R4, and a gate also connected to the second terminal 44 by way of the second inverter 58, where the input of the inverter 58 is connected to the second terminal 44 and the output of the inverter 58 is connected to the gate of T6.

The control circuitry 54 is representative to show how the level translator works, but is not a strict construction, which will be shown and discussed with reference to FIG. 5. However, FIG. 4 illustrates how the respective switches S1 and S2 are controlled by their respective inputs A and B.

When the input A at the first terminal 42 changes state from logic low to logic high, the second one-shot 48, and the second transistors T2 will cause the second terminal 44 to be pulled high. The second terminal 44 will stay at a high state vis pull-up resistor R2 once the second one-shot 48 has expired. The fifth and sixth transistors T5 and T6 will be OFF and the level translator 40 will pass a high signal (the second terminal 44 will be high). On the other hand, when input signal A at the first terminal 42 changes state from high to low, the fourth one-shot 52 and the fourth transistors T4 will turn ON and the second terminal 44 is pulled low. The fifth and sixth transistors T5 and T6 will keep the second terminal 44 at a low state once the fourth one-shot 52 has expired. The switches T5 and T6 are enabled only when the first terminal 42 is low. The second switch S2 will be OFF (i.e., open) when the first terminal 42 is low, which reduces the leakage current. When the one-shot 52 has expired, the SPMI bus should have a high Z state and any master or slave can start using the bus.

When the second terminal 44 is the input, then when the input B changes state from logic low to logic high, the first one-shot 46, and the first transistors T1 will cause the first terminal 42 to be pulled high. The first terminal 42 will stay at a high state vis pull-up resistor R1 once the first one-shot 46 has expired. The fifth and sixth transistors T5 and T6 will be OFF and the level translator 40 will pass a high signal (the first terminal 42 will be high). On the other hand, when input signal B at the second terminal 44 changes state from high to low, the third one-shot 50 and the third transistors T3 will turn ON and the first terminal 42 is pulled low. The fifth and sixth transistors T5 and T6 will keep the first terminal 42 at a low state once the third one-shot 50 has expired. The switches T5 and T6 are enabled only when the first terminal 42 is low. The first switch S1 will be OFF (i.e., open) when the input signal (B) is low, which reduces the leakage current. When the one-shot 50 has expired, the SPMI bus should have a high Z state and any master or slave can start using the bus.

In one embodiment of the present invention, the first voltage source VCCA can be less than or equal to the second voltage source VCCB, and in one embodiment, the level translator 40 is used in a system having one or more master devices coupled to one or more slave devices using the SPMI protocol (as shown in FIG. 1), where the level translator 40 is located between a master device operating at 1.2V and one or more slave devices operating at 1.8V, so in such case VCCA is 1.2V and VCCB is 1.8V.

Figure 5:
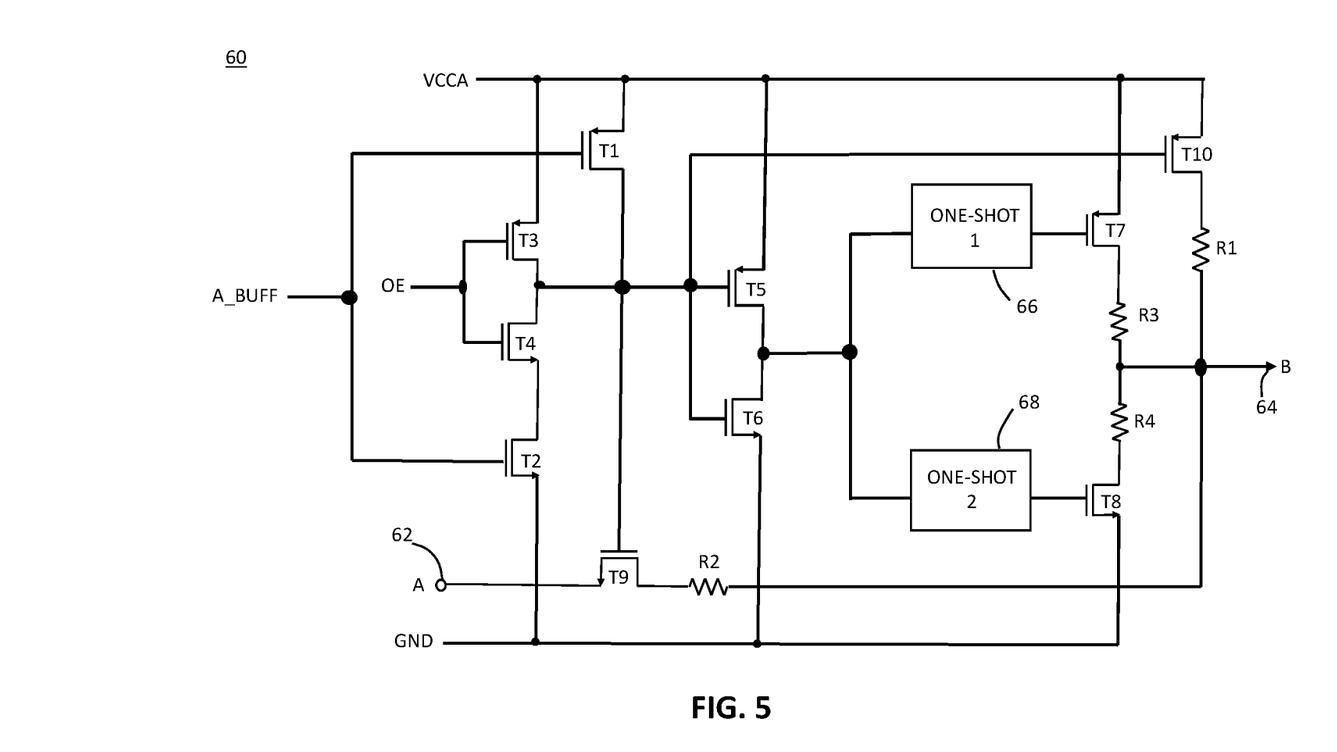
FIG. 5 is a schematic circuit diagram of an output driver circuit in accordance with an embodiment of the present invention.

FIG. 5 is a schematic diagram of an output driver circuit 60 of a level translator in accordance with a preferred embodiment of the present invention. The output driver circuit includes IO terminals 62 and 64 for IO signals "A" and "B", and first and second one-shot circuits 66 and 68. The IO terminals 62 and 64 also are referred to as input and output nodes, respectively. The output driver circuit 60 also includes first through tenth transistors T1-T10 and first through fourth resistors R1-R4.

As will be apparent to those of skill in the art, the output driver circuit 60 is one-half of a level translator circuit. For example, the first and second one-shots 66 and 68 of FIG. 5 compare to the first and third one-shots 46 and 50 of FIG. 4 (or to the second and fourth one-shots 48 and 52 of FIG. 4) and the switch S1 is analogous to T10. The output driver circuit 60 receives an input signal A at the IO terminal 62 and generates an output signal B at the IO terminal 64.

The circuit for level translating B to A is analogous, except that the inputs would be VCCB instead of VCCA, B_buff instead of A_buff, and B instead of A, and then the output would be A instead of B, and thus a separate but substantially identical schematic is not shown.

The first transistor T1 has a source connected to a first voltage source (VCCA) and a gate that receives a buffered version (A_buff) of the input signal A. The buffered input signal A_buff may be generated using one or more inverter pairs or a buffer circuit, or by inputting the signal A through a Schmitt trigger for noise margin and then a buffer circuit, as will be understood by those of skill in the art. The second transistor T2 has a source connected to ground and a gate that receives the buffered input signal A_buff. Thus, the gates of the first and second transistors T1 and T2 are connected together.

The third and fourth transistors T3 and T4 are connected in series between the first voltage source VCCA and the drain of the second transistor T2. That is, a source of the third transistor T3 is connected to the first voltage source (VCCA), a source of the fourth transistor is connected to a drain of the second transistor T2, the drains of the third and fourth transistors T3 and T4 are connected together, and gates of the third and fourth transistors receive an output enable signal (OE).

The output enable signal OE is a signal generated by a control circuit that is used to enable the output driver circuit 60. In the current embodiment, when OE is high, then the circuit 60 is enabled and functions as a level shifter, and when OE is low, the circuit 60 is disabled.

The fifth and sixth transistors T5 and T6 are connected in series between the first voltage source (VCCA) and ground, where drains of the fifth and sixth transistors T5 and T6 are connected together and to the inputs of the first and second one-shot circuits 66 and 68, the source of the fifth transistor T5 is connected to VCCA, and the source of the sixth transistor T6 is connected to ground. The gates of the fifth and sixth transistors T5 and T6 are connected together and to the drains of the first, third and fourth transistors T1, T3 and T4.

The seventh and eighth transistors T7 and T8 are connected in series between the first voltage source (VCCA) and ground. The seventh and eighth transistors T7 and T8 have drains that are connected together by way of the resistors R3 and R4, and gates that are connected to respective ones of the outputs of the first and second one-shot circuits 66 and 68. The ninth transistor T9 has a source connected to the input terminal 62, a drain connected to the output terminal 64, and a gate that is activated by the output enable signal (OE). That is, the gate is connected to a node between the drains of the third and fourth transistors T3 and T4, and also to the drain of the first transistor T1. The tenth transistor T10 has a source connected to the first voltage source (VCCA), a drain connected to the output terminal 64, and a gate that is activated by the output enable signal (OE). Thus, like the transistor T9, the gate of the transistor T10 is connected to the node between the drains of the third and fourth transistors T3 and T4, and also to the drain of the first transistor T1.

The first resistor R1 is connected between the drain of the tenth transistor T10 and the output terminal 64 (i.e., the same as R1 in FIG. 4). The second resistor R2 is connected between the drain of the ninth transistor and the output terminal 64. The third and fourth resistors R3 and R3 are connected in series between the drains of the seventh and eighth transistors T7 and T8, and a node between the third and fourth resistors R3 and R4 is connected to the output terminal 64.

The first and second one-shot circuits 66 and 68 drive the output signal B at the output node 64 from low to high and high to low using the transistors T7 and T8, respectively. That is, the seventh transistor T7 works with the first one-shot circuit 66 to pull the output signal (i.e., output node 64) from low to high and the eighth transistor T8 works with the second one-shot circuit 68 to pull the output signal (i.e., output node 64) from high to low. SPMI bus timing may be achieved by using a one-shot duration of less than 10 nSec, for example.

When the output node 64 is high, after the first one-shot 66 has expired, the tenth transistor T10 and the first resistor R1 pull-up the output node 64, and when the output is low, after the second one-shot 68 has expired, the ninth transistor T9 and the second resistor R2 will keep the output node 64 low. Thus, the ninth transistor T9 and the second resistor R2 will keep the output node 64 in a low High Z condition during SPMI Bus Park cycle. The tenth transistor T10 switches off the pull-up path when the output node 64 is low, and the ninth transistor T9 will switch off the path from B to A (or A to B) during the high cycle. The OE signal is used to control the pull-up logic as well as the switch used for the Bus Park cycle.

As discussed above, to implement a level translator, another one of the output buffer circuits 60 would be provided. Where the circuit 60 generates a signal B upon receipt of a signal A, the second buffer circuit would be used to generate A when B is provided, and the circuit 60 would be receive a B_buff signal instead of an A_buff signal.

Referring again to FIG. 1, the level translator 18 of the present invention is beneficial in a system having one or more master devices 12 located in a first voltage domain connected to a plurality of slave devices 16 located in a second voltage domain, for example, where the one or more master devices 12 operate at 1.2V and the plurality of slave devices 16 operate at 1.8V, with the slave devices 16 being coupled to the master device by way of the SPMI bus 20. There also could be one or more additional slave devices 14 coupled to the master device(s) 12 that operate at 1.2V.

In such case, the system 10 comprises a first voltage domain connected to a first voltage source for operating at a first voltage level (VCCA), a second voltage domain connected to a second voltage source for operating at a second voltage level (VCCB) different from the first voltage level, and the level translator 18 located between the first and second voltage domains for passing signals therebetween, such that a first signal A passed from the first voltage domain to the second voltage domain has its voltage level changed to the second voltage level by the level translator 18, and a second signal B passed from the second voltage domain to the first voltage domain has its voltage level changed from the second voltage level to the first voltage level by the level translator 18.

The level translator 18 includes a first terminal that receives the first signal A and outputs the second signal B, and a second terminal that receives the second signal B and outputs the first signal A; and a first switch located between the first voltage source VCCA and the first terminal (S1 in FIG. 4) and a second switch (S2 in FIG. 4) located between the second voltage source (VCCB) and the second terminal, where the first and second switches S1 and S2 are operable to reduce current leakage of the level translator. Thus, the first and second switches S1 and S2 are on during a rise time of the input signal, thereby preventing current leakage from the first terminal to the second terminal and from the second terminal to the first terminal.

The level translator of the present invention has the advantage of being able to operate in accordance with SPMI bus protocol, where, for example, Hi-Z states are preserved and signal rise and fall times are within specification. Another advantage is that the circuit has a low leakage current due to the use of the switches S1 and S2. The circuit also consumes less power than conventional level translators because there is no DC path to ground. The level translator of the present invention can be used in either push-pull or open drain applications. While the present invention is primarily designed to work as a Level Translator for SPMI, operating from 1.2V to 1.8V and vice-versa, the circuit can be used in an open drain configuration for I2C applications. The level translator of the present invention also can be used as a bus driver or buffer for a high capacitive bus. The present invention also can be used for I3C applications, where there is a combination of push-pull and open drain. The circuitry of the present invention also may be used as a buffer in an I2C application to improve rise and fall times if there are high capacitive loads.

In describing transistors, the terms gate terminal and gate, drain terminal and drain, and source terminal and source have been used interchangeably. The terms high and low have been used to refer to a high logic state and a low logic state. As will be understood by those of skill in the art, the circuits shown in the drawings may be implemented using either p-channel or n-channel MOS transistors (PMOS or NMOS). The terms "about" and "around", when used to refer to numerical values, e.g., about 1.2V, mean within plus or minus 10% of the numerical value.

As used herein, the terms "comprising", "including" and "having" and conjugations thereof are open ended terms, whereas the term "consisting" is a closed ended term.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A level translator that receives an input signal at an input terminal A, and generates an output signal at an output terminal B, the level translator comprising:
   first, second, third and fourth one-shot circuits, wherein the first and third one-shot circuits each has an output connected to the input terminal A and the second and fourth one-shot circuits each has an output connected to the output terminal B;
   a first transistor having a source connected to a first voltage source, a drain connected to the input terminal A, and a gate connected to an output of the first one-shot circuit;
   a second transistor having a drain connected to a second voltage source that is different from the first voltage source, a source connected to the output terminal B, and a gate connected to an output of the second one-shot circuit;
   a third transistor having a source connected to the input terminal A, a drain connected to ground, and a gate connected to an output of the third one-shot circuit;
   a fourth transistor having a source connected to ground, a drain connected to the output terminal B, and a gate connected to the output of the fourth one-shot circuit;
   a first switch connected in parallel with the first transistor, wherein the first switch has a first terminal connected to the first voltage source and a second terminal connected to the input terminal A; and
   a second switch connected in parallel with the second transistor, wherein the second switch has a first terminal connected to the second voltage source and a second terminal connected to the output terminal B.

2. The level translator of claim 1, wherein the first and second switches are on during a rise time of the input signal, thereby preventing current leakage from the input terminal A to the output terminal B and from the output terminal B to the input terminal A.

3. The level translator of claim 2, further comprising a first resistor connected between the first switch and the input terminal A and a second resistor connected between the second switch and the output terminal B.

4. The level translator of claim 3, wherein:
   when the input signal goes from low to high, the output signal is pulled high,
   when the input signal is high, the output signal stays high,
   when the input signal goes from high to low, the output signal is pulled low, and
   when the input signal is low, the output signal stays low.

5. The level translator of claim 1, wherein the first voltage source is less than the second voltage source.

6. The level translator of claim 5, wherein the first voltage source is around 1.2V and the second voltage source is around 1.8V.

7. The level translator of claim 1, further comprising:
   a fifth transistor having a source connected to the input terminal A by way of a third resistor and a drain connected to the output terminal B;
   a sixth transistor having a source connected to the input terminal A and a drain connected to the output terminal B by way of a fourth resistor;
   a first inverter having an input connected to the input terminal A and an output connected to a gate of the fifth transistor; and
   a second inverter having an input connected to the output terminal B and an output connected to a gate of the sixth transistor.

8. The level translator of claim 1, further comprising:
   a first resistor connected between the first switch and the input terminal A;
   a second resistor connected between the second switch and the output terminal B;
   a fifth transistor having a source connected to the input terminal A by way of a third resistor and a drain connected to the output terminal B;
   a sixth transistor having a source connected to the input terminal A and a drain connected to the output terminal B by way of a fourth resistor;
   a first inverter having an input connected to the input terminal A and an output connected to a gate of the fifth transistor; and
   a second inverter having an input connected to the output terminal B and an output connected to a gate of the sixth transistor,
   wherein the first and second switches are on during a rise time of the input signal, thereby preventing current leakage from the input terminal A to the output terminal B and from the output terminal B to the input terminal A, and
   wherein the first voltage source is less than the second voltage source.

9. An output driver circuit of a level translator, wherein the level translator receives an input signal at an input terminal, and generates an output signal at an output terminal, the output driver circuit comprising:
   a first one-shot circuit having an input and an output;
   a second one-shot circuit having an input and an output;
   a first transistor having a source connected to a first voltage source (VCCA) and a gate that receives a buffered version of the input signal;
   a second transistor having a source connected to ground and a gate that receives the buffered version of the input signal;
   third and fourth transistors connected in series, wherein a source of the third transistor is connected to the first voltage source (VCCA), a source of the fourth transistor is connected to a drain of the second transistor, drains of the third and fourth transistors are connected together, and gates of the third and fourth transistors receive an output enable signal (OE);
   fifth and sixth transistors connected in series between the first voltage source (VCCA) and ground, wherein drains of the fifth and sixth transistors are connected together and to the inputs of the first and second one-shot circuits;
   seventh and eighth transistors connected in series between the first voltage source (VCCA) and ground, wherein the seventh and eighth transistors have drains that are connected together and gates that are connected to respective ones of the outputs of the first and second one-shot circuits;
   a ninth transistor having a source connected to the input terminal, a drain connected to the output terminal, and a gate that is activated by the output enable signal (OE); and a tenth transistor having a source connected to the first voltage source (VCCA), a drain connected to the output terminal, and a gate that is activated by the output enable signal (OE).

10. The output driver circuit of claim 9, further comprising a first resistor connected between the drain of the tenth transistor and the output terminal.

11. The output driver circuit of claim 10, further comprising a second resistor connected between the drain of the ninth transistor and the output terminal.

12. The output driver circuit of claim 11, further comprising third and fourth resistors connected in series between the drains of the seventh and eighth transistors, wherein a node between the third and fourth resistors is connected to the output terminal.

13. The output driver circuit of claim 12, wherein the seventh transistor works with the first one-shot circuit to pull the output signal high and the eighth transistor works with the second one-shot circuit to pull the output signal low.

14. A system, comprising:
a first voltage domain connected to a first voltage source for operating at a first voltage level (VCCA);
a second voltage domain connected to a second voltage source for operating at a second voltage level (VCCB) different from the first voltage level; and
a level translator located between the first and second voltage domains for passing signals therebetween, such that a first signal A passed from the first voltage domain to the second voltage domain has a voltage level thereof changed to the second voltage level by the level translator, and a second signal B passed from the second voltage domain to the first voltage domain has a voltage level thereof changed from the second voltage level to the first voltage level by the level translator, wherein the level translator comprises:
a first terminal that receives the first signal A and outputs the second signal B, and a second terminal that receives the second signal B and outputs the first signal A; and
a first switch located between the first voltage source and the first terminal and a second switch located between the second voltage source and the second terminal, wherein the first and second switches are operable to reduce current leakage of the level translator.

15. The system of claim 14, wherein the first voltage domain includes at least one master device and the second voltage domain includes a plurality of slave devices.

16. The system of claim 15, wherein the plurality of slave devices are connected to a SPMI bus and communicate with the master device using the SPMI protocol.

17. The system of claim 14, wherein the first voltage domain includes at least one slave device operating at the first voltage level.

18. The system of claim 14, wherein the first and second switches are on during a rise time of the input signal, thereby preventing current leakage from the first terminal to the second terminal and from the second terminal to the first terminal.

19. The system of claim 18, further comprising a first resistor connected between the first switch and the first terminal and a second resistor connected between the second switch and the second terminal.

20. The system of claim 19, wherein the level translator further comprises:
first, second, third and fourth one-shot circuits, wherein the first and third one-shot circuits each has an input connected to the second terminal and the second and fourth one-shot circuits each has an input connected to the first terminal;
a first transistor having a source connected to the first voltage source, a drain connected to the first terminal, and a gate connected to an output of the first one-shot circuit;
a second transistor having a drain connected to the second voltage source, a source connected to the second terminal, and a gate connected to an output of the second one-shot circuit;
a third transistor having a source connected to the first terminal, a drain connected to ground, and a gate connected to an output of the third one-shot circuit; and
a fourth transistor having a source connected to ground, a drain connected to the second terminal, and a gate connected to the output of the fourth one-shot circuit,
wherein the first switch is connected in parallel with the first transistor and the second switch is connected in parallel with the second transistor.

\* \* \* \* \*